United States Patent
Hayashi

(10) Patent No.: US 8,652,268 B2
(45) Date of Patent: Feb. 18, 2014

(54) SUBSTRATE TREATING METHOD FOR TREATING SUBSTRATES WITH TREATING LIQUIDS

(75) Inventor: Toyohide Hayashi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 350 days.

(21) Appl. No.: 13/016,252

(22) Filed: Jan. 28, 2011

(65) Prior Publication Data

US 2011/0126859 A1   Jun. 2, 2011

Related U.S. Application Data

(62) Division of application No. 12/052,220, filed on Mar. 20, 2008, now abandoned.

(30) Foreign Application Priority Data

Mar. 23, 2007   (JP) ................................. 2007-077170

(51) Int. Cl.
*B08B 7/04* (2006.01)
*B08B 3/00* (2006.01)
*B08B 1/02* (2006.01)
*B08B 7/00* (2006.01)

(52) U.S. Cl.
USPC .................. 134/30; 134/18; 134/26; 134/32; 134/33; 134/34; 134/57 R; 134/66; 134/69; 134/78; 134/79; 134/95.1; 134/95.2; 134/96.1

(58) Field of Classification Search
USPC ....... 134/18, 26, 30, 32, 33, 34, 57 R, 66, 69, 134/78, 79, 95.1, 95.2, 96.1
See application file for complete search history.

(56) References Cited

U.S. PATENT DOCUMENTS

| | | | |
|---|---|---|---|
| 5,974,689 | A | 11/1999 | Ferrell et al. |
| 5,980,992 | A | 11/1999 | Kistner et al. |

(Continued)

FOREIGN PATENT DOCUMENTS

| | | |
|---|---|---|
| JP | 10-22257 | 1/1998 |
| JP | 2000-91300 | 3/2000 |
| KR | 10-1999-0075167 | 10/1999 |
| KR | 10-2005-0122025 | 12/2005 |

OTHER PUBLICATIONS

Office Action issued Apr. 23, 2009 in connection with corresponding Korean Patent Application No. 10-2008-0020382.

(Continued)

*Primary Examiner* — Michael Barr
*Assistant Examiner* — Charles W Kling
(74) *Attorney, Agent, or Firm* — Ostrolenk Faber LLP

(57) ABSTRACT

A method for treating substrates with treating liquids, using a treating tank for storing the treating liquids, a holding mechanism for holding the substrates in a treating position inside the treating tank, first and second treating liquid supply devices, a temperature control device, and a control device. A first treating liquid is supplied into the treating tank, then a second treating liquid of lower surface tension and higher boiling point than the first treating liquid is supplied, and placed in a temperature range above the boiling point of the first treating liquid and below the boiling point of the second treating liquid. Then the second treating liquid supply device may be controlled to replace the first treating liquid with the second treating liquid, while controlling the temperature control device to maintain the second treating liquid in the same temperature range.

5 Claims, 7 Drawing Sheets

(56) References Cited

U.S. PATENT DOCUMENTS

| | | | |
|---|---|---|---|
| 6,119,366 A | 9/2000 | Ferrell et al. | |
| 6,216,364 B1 | 4/2001 | Tanaka et al. | |
| 6,297,308 B1 | 10/2001 | Jariwala et al. | |
| 6,310,018 B1 * | 10/2001 | Behr et al. | 510/175 |
| 6,354,311 B1 | 3/2002 | Kimura et al. | |
| 6,589,339 B2 * | 7/2003 | Takeshita et al. | 118/50 |
| 6,637,445 B2 | 10/2003 | Ogasawara et al. | |
| 2001/0047595 A1 | 12/2001 | Mehmandoust | |
| 2002/0096196 A1 * | 7/2002 | Toshima et al. | 134/21 |
| 2002/0107160 A1 | 8/2002 | Zazzera et al. | |
| 2005/0196523 A1 | 9/2005 | Marumo | |
| 2006/0042722 A1 | 3/2006 | Kim et al. | |
| 2006/0266389 A1 | 11/2006 | Thakur et al. | |

OTHER PUBLICATIONS

Notice of Allowance issued Oct, 22, 2009 in connection with corresponding Korean Patent Application No. 10-2008-0020382.

* cited by examiner

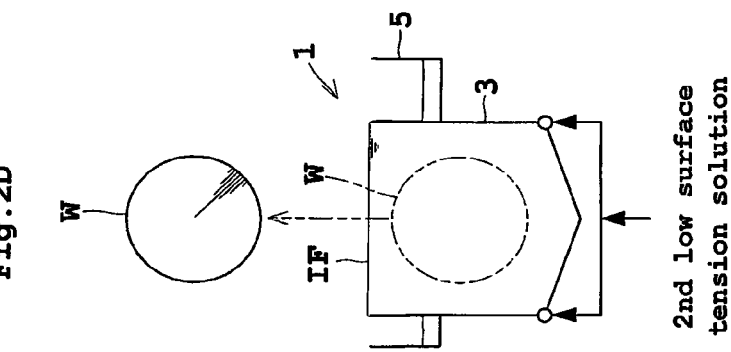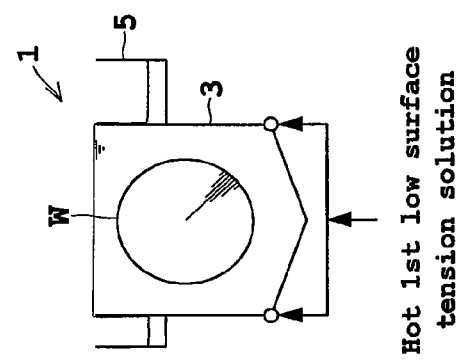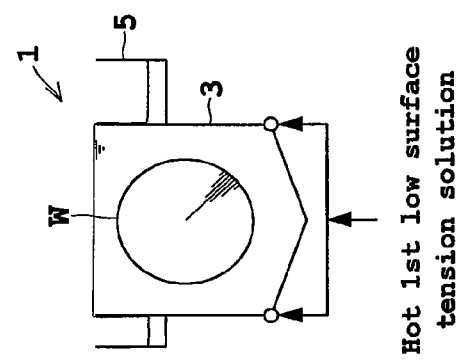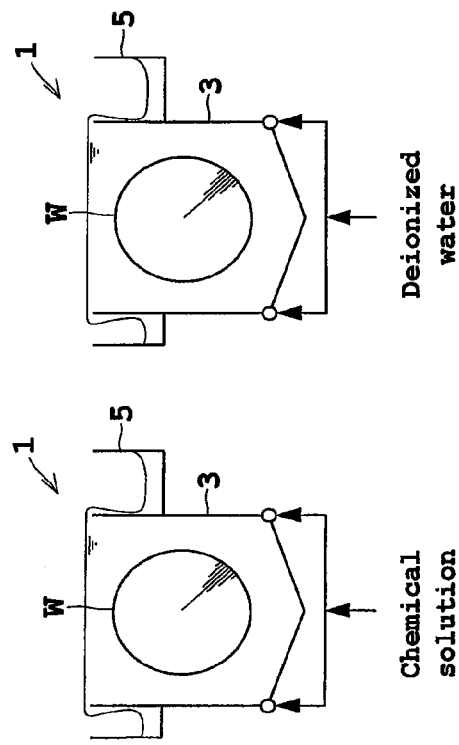

Fig. 4A Chemical solution

Fig. 4B Deionized water

Fig. 4C Hot 1st low surface tension solution

Fig. 4D Hot atmosphere

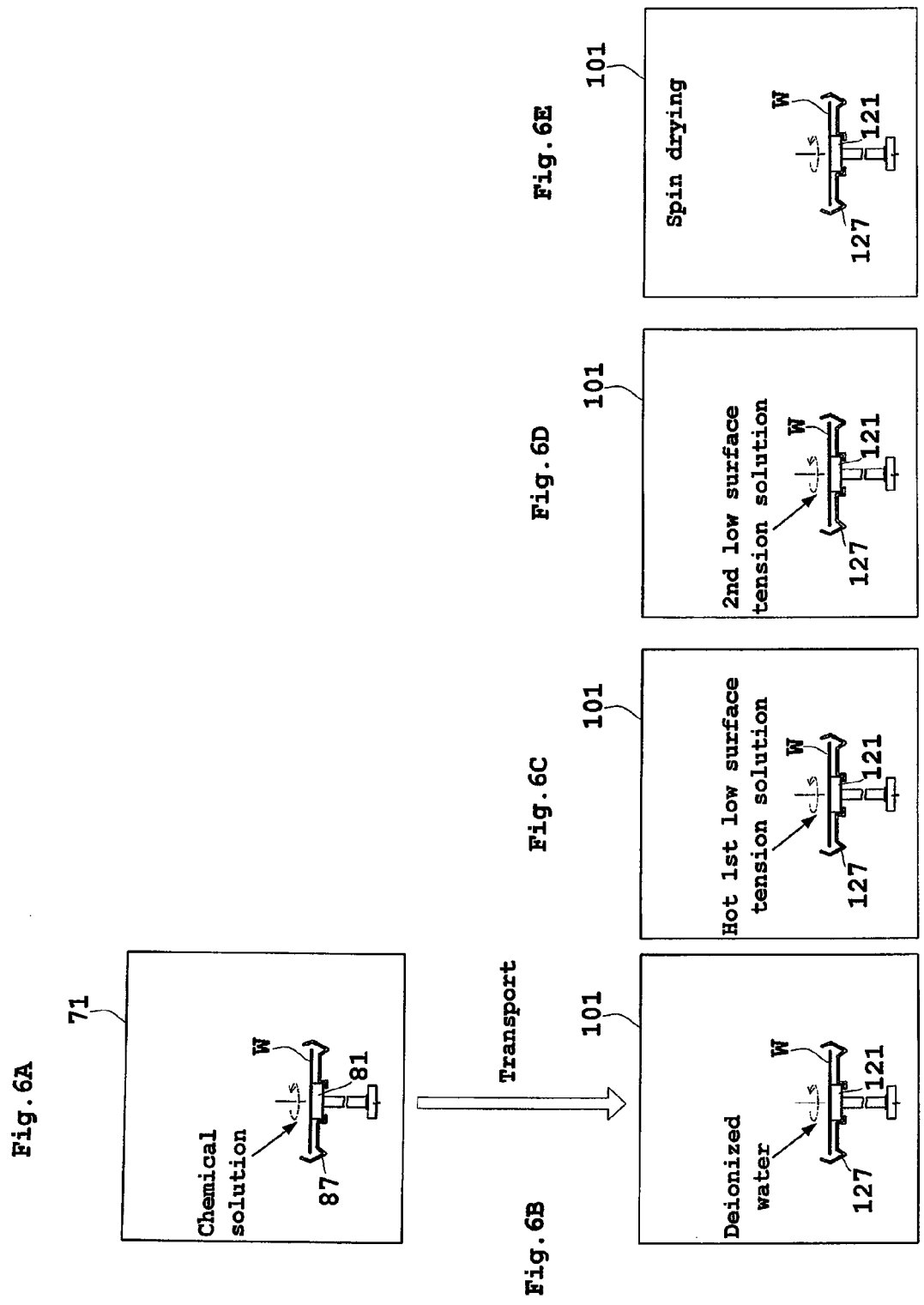

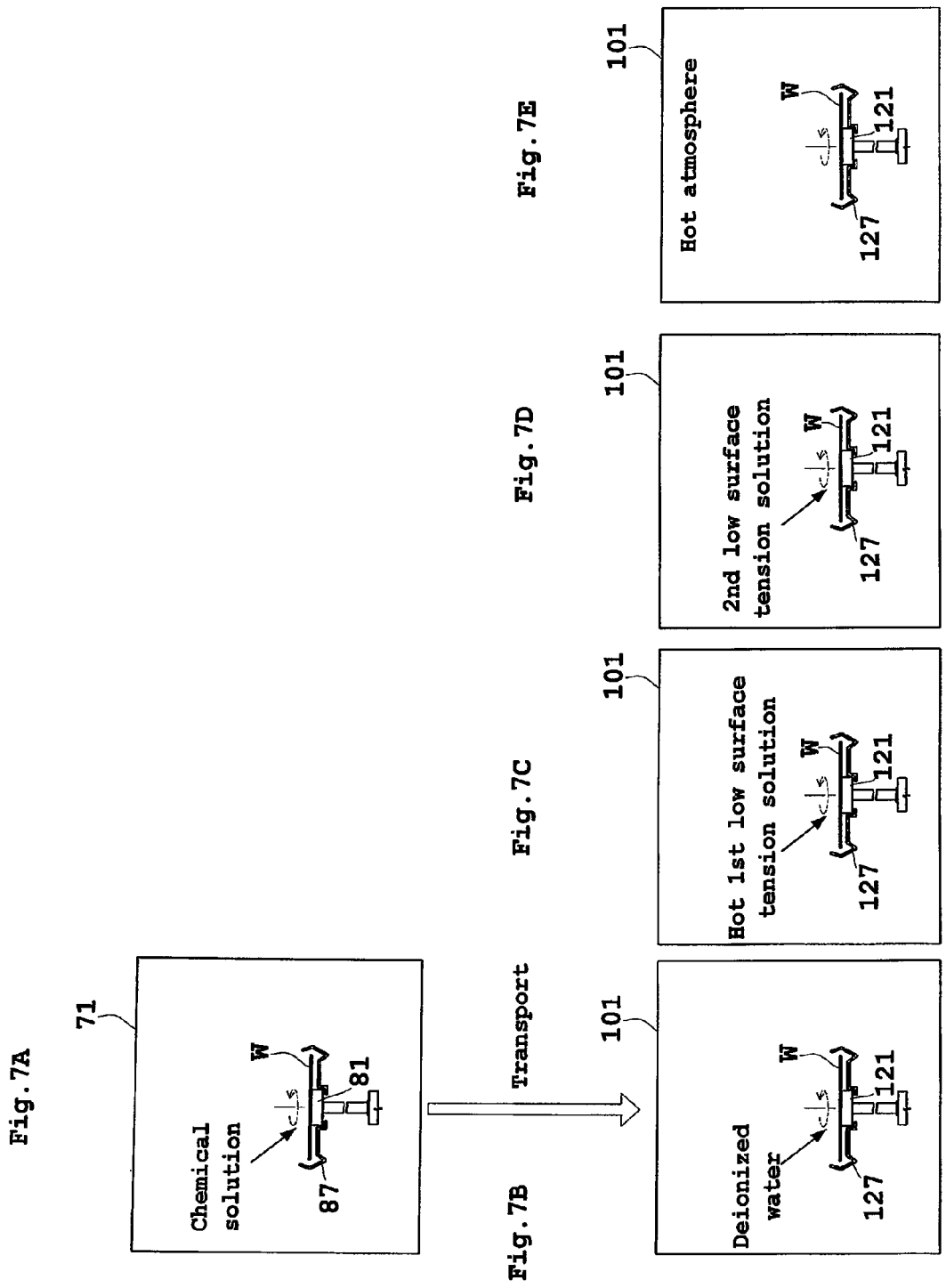

SUBSTRATE TREATING METHOD FOR TREATING SUBSTRATES WITH TREATING LIQUIDS

CROSS REFRENCE TO RELATED APPLICATIONS

The present application is a Divisional Application of U.S. Ser. No. 12/052,220 filed Mar. 20, 2008, which application claims the benefit and priority of JP2007-077170 filed Mar. 23, 2007, both incorporated by reference.

BACKGROUND OF THE INVENTION

1. Field of the Invention

This invention relates to a substrate treating apparatus for treating, e.g. cleaning, substrates such as semiconductor wafers or glass substrates for liquid crystal displays (hereinafter called simply substrates) with treating liquids such as a chemical solution and deionized water.

2. Description of the Related Art

Conventionally, this type of apparatus includes, for example, a treating tank for storing a treating liquid and receiving substrates, and a nozzle for supplying isopropyl alcohol (IPA) gas to an upper space in the treating tank (see Japanese Unexamined Patent Publication H10-22257 (paragraphs "0024" and "0025", and FIG. 3), for example). With this apparatus, after supplying deionized water to the treating tank and cleaning substrates, IPA gas is supplied to the upper space in the treating tank to form an IPA atmosphere therein. Then, the substrates are pulled up from the treating tank to complete cleaning treatment of the substrates with deionized water. By pulling up and moving the substrates in the IPA atmosphere, the deionized water adhering to the substrates is replaced with IPA to promote drying of the substrates.

The conventional apparatus with such construction has the following drawback.

The conventional apparatus can promote drying by pulling up the substrates cleaned with deionized water out of the deionized water, and moving the substrates in the IPA atmosphere. However, there is a drawback that the pattern formed on the surface of each substrate can collapse.

That is, the pattern on the substrate surface collapses due to the surface tension of the deionized water on the substrate pulled up.

In the latest semiconductor devices, particularly in the field of memory, capacitors constructed in a cylindrical shape have begun to be employed as a technique for drastically increasing the degree of integration. Such a cylindrical structure has a very high aspect ratio, and a capacitor portion of cylindrical structure collapses easily during a manufacture process. Naturally, a collapse of the capacitor portion renders the device defective, and thus lowers yield.

It is conceivable to reduce the chances of collapse of the pattern by replacing the deionized water in the treating tank with a liquid with low surface tension, after the substrate cleaning with the deionized water in the treating tank noted above, and then pulling up the substrates from the treating tank and drying the substrates. However, the deionized water having entered minutia of the patterns on the substrate surfaces can remain without being fully replaced. It is thus impossible to eliminate collapse of the patterns formed on the substrates completely.

SUMMARY OF THE INVENTION

This invention has been made having regard to the state of the art noted above, and its object is to provide a substrate treating apparatus which can prevent collapse of patterns formed on substrates.

The above object is fulfilled, according to this invention, by a substrate treating apparatus for treating substrates with treating liquids, comprising a treating tank for storing the treating liquids; a holding mechanism for holding the substrates and placing the substrates in a treating position inside the treating tank; a first treating liquid supply device for supplying a first treating liquid into the treating tank; a second treating liquid supply device for supplying a second treating liquid of lower surface tension than the first treating liquid, and higher boiling point than the first treating liquid, into the treating tank; a temperature control device for controlling temperature of the second treating liquid in the treating tank to be in a temperature range above the boiling point of the first treating liquid and below the boiling point of the second treating liquid; and a control device for controlling the second treating liquid supply device to replace the first treating liquid supplied from the first treating liquid supply device and stored in the treating tank with the second treating liquid, and controlling the temperature control device to maintain the second treating liquid in the temperature range.

The substrates are placed in the treating position inside the treating tank by the holding mechanism. The substrates inside the treating tank are treated with the first treating liquid. Then, the control device controls the second treating solution supply device to replace the first treating liquid stored in the treating tank with the second treating liquid, and controls the temperature control device to maintain the second treating liquid in the temperature range above the boiling point of the first treating liquid and below the boiling point of the second treating liquid. Therefore, the substrates treated with the first treating liquid in the treating tank are immersed in the second treating liquid controlled to a temperature higher than the boiling point of the first treating liquid. The first treating liquid remaining on the surfaces of the substrates (including the first treating liquid having entered and remaining in minutia of the patterns on the surfaces of the substrates) is evaporated by the thermal energy of the hot second treating liquid. Its bubbles ascend to the surface of the second treating liquid in the treating tank, and leave the treating tank in the form of vapor. Thus, the first treating liquid having entered and remaining in minutia of the patterns on the surfaces of the substrates can be completely replaced with the second treating liquid. The substrates taken out of the treating tank do not pass through an interface of the first treating liquid having high surface tension, but pass only through an interface of the second treating liquid having lower surface tension than the first treating liquid. Only the low surface tension acts on the surfaces of the substrates when passing through the interface of the second treating liquid, thereby preventing collapse of the patterns formed on the substrates. Only the second treating liquid with the low surface tension remains on the surfaces of the substrates pulled up. The surfaces of the substrates are subjected to the low surface tension when drying the second treating liquid, which prevents collapse of the patterns formed on the substrates.

The apparatus according to this invention may further comprise a third treating liquid supply device for supplying a third treating liquid of lower surface tension than the first treating liquid, and lower boiling point than the second treating liquid, into the treating tank; wherein the holding mechanism is vertically movable, while holding the substrates, between the treating position inside the treating tank and a standby position above the treating tank; and wherein the control device is arranged to control the third treating liquid supply device to replace the second treating liquid stored in the treating tank with the third treating liquid after substrate treatment with the second treating liquid maintained in the temperature range, and to control the holding mechanism to raise the substrates to the standby position after replacement with the third treating liquid inside the treating tank.

The substrates are pulled up and dried after the second treating liquid stored in the treating tank is replaced with the third treating liquid of lower surface tension than the first treating liquid and lower boiling point than the second treating liquid. This requires a shorter drying time than where the substrates are pulled up out of the second treating liquid. That is, the third treating liquid allows the substrates to dry more quickly than the second treating liquid because of the lower boiling point.

The apparatus according to this invention may further comprise a thermal drying device for drying the substrates having undergone treatment with the second treating liquid in a hot atmosphere; wherein the control device is arranged to control the thermal drying device to dry the substrates in the hot atmosphere after treatment with the second treating liquid maintained in the temperature range.

The treatment with the second treating liquid under temperature control evaporates and removes the first treating liquid having entered and remaining in minutia of the patterns on the surfaces of the substrates. Thus, the second treating liquid on the surfaces of the substrates and having low surface tension can be dried in the hot atmosphere, thereby preventing collapse of the patterns formed on the substrates.

The apparatus according to this invention may further comprise an air drying device for drying, by air contact, the substrates having undergone treatment with the second treating liquid; wherein the control device is arranged to control the air drying device to dry the substrates by air contact after treatment with the second treating liquid maintained in the temperature range.

The treatment with the second treating liquid under temperature control evaporates and removes the first treating liquid having entered and remaining in minutia of the patterns on the surfaces of the substrates. Thus, the second treating liquid on the surfaces of the substrates and having low surface tension can be dried by air contact, thereby preventing collapse of the patterns formed on the substrates.

In another aspect of the invention, a substrate treating apparatus for treating substrates with treating liquids comprises a treating unit having a spin holding mechanism disposed therein for spinnably holding a substrate in horizontal posture, the treating unit treating the substrate held by the spin holding mechanism with the treating liquids; a first treating liquid supply device for supplying a first treating liquid to the substrate spun by the spin holding mechanism inside the treating unit; a second treating liquid supply device for supplying a second treating liquid of lower surface tension than the first treating liquid, and higher boiling point than the first treating liquid, to the substrate spun by the spin holding mechanism inside the treating unit; a temperature control device for controlling temperature of the second treating liquid supplied to the substrate spun by the spin holding mechanism inside the treating unit to be in a temperature range above the boiling point of the first treating liquid and below the boiling point of the second treating liquid; and a control device for controlling the temperature control device the second treating liquid supply device to supply the second treating liquid in the temperature range to the substrate spun by the spin holding mechanism inside the treating unit after treatment of the substrate with the first treating liquid.

The first treating liquid is supplied to the substrate spinnably held by the spin holding mechanism inside the treating unit to carry out treatment with the first treating liquid. Then, the control device controls the temperature control device and second treating solution supply device, after the treatment of the substrate with the first treating liquid, to supply the second treating liquid in the temperature range above the boiling point of the first treating liquid and below the boiling point of the second treating liquid to the substrate spun by the spin holding mechanism inside the treating unit. Thus, the second treating liquid controlled to a temperature higher than the boiling point of the first treating liquid is supplied to the substrate treated with the first treating liquid in the treating unit. The first treating liquid remaining on the surface of the substrate (including the first treating liquid having entered and remaining in minutia of the pattern on the surface of the substrate) is evaporated by the thermal energy of the hot second treating liquid to leave the surface of the substrate and exit the treating unit in the form of vapor. Thus, the first treating liquid having entered and remaining in minutia of the pattern on the surface of the substrate can be completely replaced with the second treating liquid. Only the second treating liquid with the low surface tension remains on the surface of the substrate. The surface of the substrate is subjected to the low surface tension when drying the second treating liquid, which prevents collapse of the pattern formed on the substrate.

The above apparatus may further comprise a third treating liquid supply device for supplying a third treating liquid of lower surface tension than the first treating liquid, and lower boiling point than the second treating liquid, to the substrate spun by the spin holding mechanism inside the treating unit; wherein the control device is arranged to control the third treating liquid supply device to supply the third treating liquid to the substrate spun by the spin holding mechanism inside the treating unit after substrate treatment with the second treating liquid maintained in the temperature range, and to control the spin holding mechanism to spin the substrates after completion of supply of the third treating liquid to the substrate.

The substrate is spin-dried after the second treating liquid on the surface of the substrate is replaced with the third treating liquid of lower surface tension than the first treating liquid and lower boiling point than the second treating liquid. This requires a shorter drying time than where the substrate is spin-dried with the second treating liquid remaining thereon. That is, the third treating liquid allows the substrates to dry more quickly than the second treating liquid because of the lower boiling point.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIGS. 2A-2D are schematic views showing an example of treatment in Embodiment 1;

FIGS. 6A-6E are schematic views showing an example of treatment in Embodiment 3; and FIGS. 7A-7E are schematic views showing a modified example of treatment.

DESCRIPTION OF THE PREFERRED EMBODIMENTS

Embodiments of this invention will be described in detail hereinafter with reference to the drawings.

Embodiment 1

Figure 1:
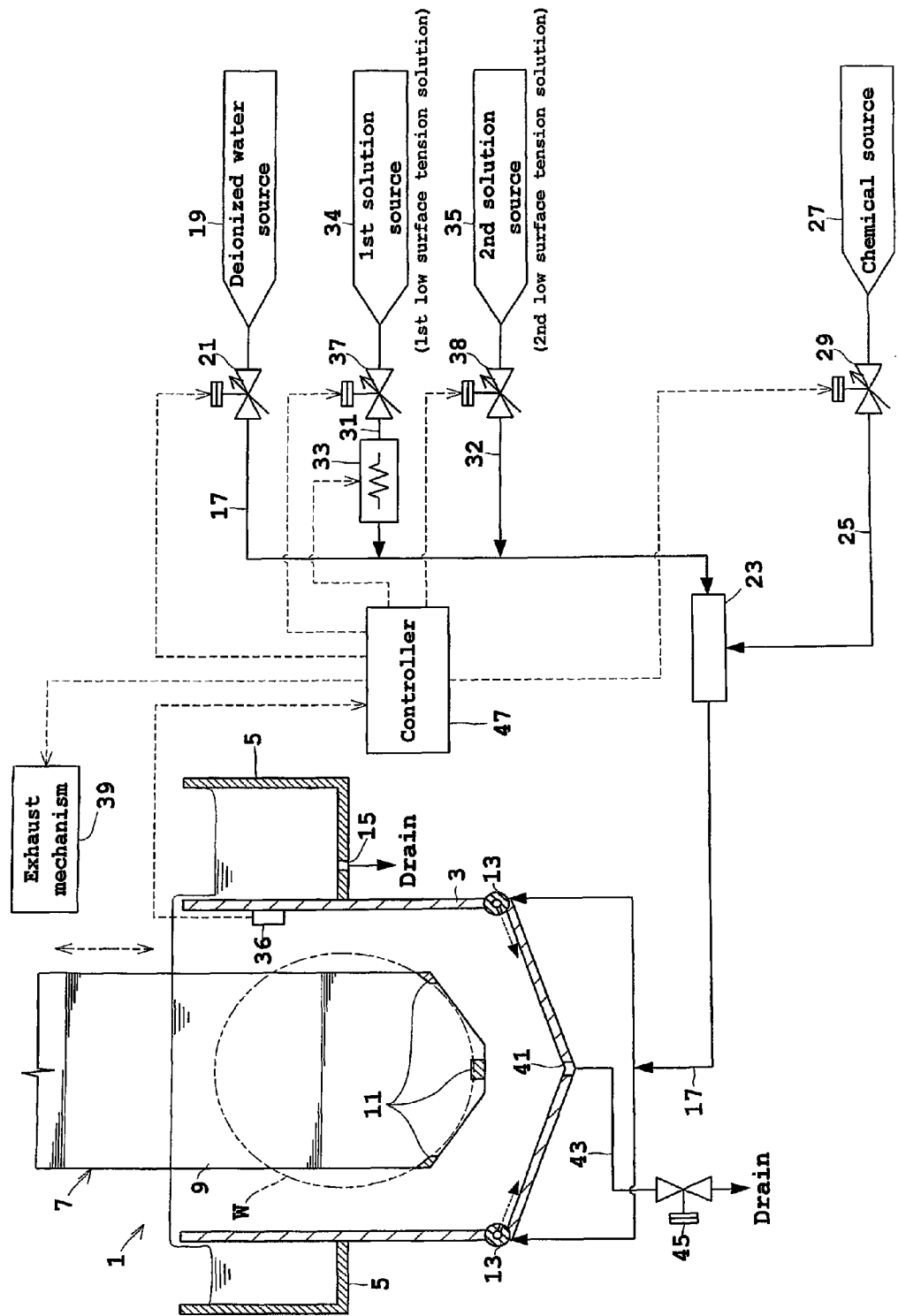
FIG. 1 is a schematic view of a substrate treating apparatus in Embodiment 1.

FIG. 1 is a schematic view of a substrate treating apparatus in Embodiment 1.

A treating tank 1 includes an inner tank 3 and an outer tank 5. The inner tank 3 stores a treating liquid or solution, and can receive wafers W held by a holding arm 7. A plurality of wafers W are arranged in vertical posture on the holding arm 7 to be loaded into and unloaded from the apparatus. The holding arm 7 includes a plate-like arm portion 9, and three support elements 11 arranged on lower positions of the arm portion 9 to extend perpendicular to the arm portion 9 for contacting lower edges of the wafers W and supporting the wafers W. The holding arm 7 is vertically movable, while holding the wafers W, between a treating position inside the inner tank 3 and a standby position above the inner tank 3. The inner tank 3 stores a treating liquid or solution, and the treating liquid overflowing the inner tank 3 is collected in the outer tank 5 surrounding an upper portion of the inner tank 3. The inner tank 3 has two jet pipes 13 disposed at opposite sides in the bottom thereof for supplying the treating liquid into the inner tank 3. The outer tank 5 has a drain port 15 formed in the bottom thereof. The treating liquid overflowing the inner tank 3 into the outer tank 5 is drained through the drain port 15.

The jet pipes 13 are connected to one end of a supply pipe 17 having the other end connected to a deionized water source 19. The supply pipe 17 has a control valve 21 disposed downstream of the deionized water source 19 for controlling flow rate. The supply pipe 17 has a mixing valve 23 disposed downstream of the control valve 21. The mixing valve 23 has a function for mixing a chemical into deionized water flowing through the supply pipe 17. The mixing valve 23 is connected to one end of a filling pipe 25 having the other end connected to a chemical source 27. The filling pipe 25 has a control valve 29 disposed downstream of the chemical source 27 for controlling flow rate. Generally, two or more types of chemicals can be introduced into the mixing valve 23, but this is not illustrated in this embodiment. In this embodiment, hydrogen fluoride (HF) is mixed in a predetermined ratio into the deionized water in circulation, for example, to produce and supply a chemical solution as a treating solution for removing oxide film from the substrate surfaces. It is also possible to mix ammonia and a hydrogen peroxide solution in predetermined ratios into the deionized water in circulation to produce and supply a chemical solution as a treating solution for removing particles or organic matters (this process being called "SC1").

The holding arm 7 noted above corresponds to the holding mechanism in this invention.

One end of each of branch pipes 31 and 32 is connected to the supply pipe 17 between the control valve 21 and mixing valve 23. A first solution source 34 is connected to the other end of the branch pipe 31. A second solution source 35 is connected to the other end of the branch pipe 32. The branch pipes 31 and 32 have control valves 37 and 38 for adjusting flow rates, respectively.

The first solution source 34 stores a first low surface tension solution, for example. The first low surface tension solution refers to a solution of lower surface tension than deionized water, and higher boiling point than deionized water. This solution may, for example, be a fluoric inactive solution such as Fluorinert (registered trademark of Sumitomo 3M Ltd.) heat transfer liquid or Galden (registered trademark of Solvay Solexis) heat transfer liquid. Fluorinert (registered trademark of Sumitomo 3M Ltd.) and Galden (registered trademark of Solvay Solexis) have surface tension at about 0.014-0.016 [N/m] and a boiling point at 130-180° C.

The second solution source 35 stores a second low surface tension solution, for example. The second low surface tension solution refers to a solution of lower surface tension than deionized water, and lower boiling point than the first low surface tension solution. This solution may, for example, be a fluoric inactive solution such as of HFE (hydrofluoroether) or HFC (hydrofluorocarbon). HFE (hydrofluoroether) has surface tension at about 0.0136 [N/m] and a boiling point at 60-80[°] C.

The jet pipes 13, supply pipe 17 and control valve 21 correspond to the first treating solution supply device in this invention. The jet pipes 13, supply pipe 17, branch pipe 31 and control valve 37 correspond to the second treating solution supply device in this invention. The jet pipes 13, supply pipe 17, branch pipe 32 and control valve 38 correspond to the third treating solution supply device in this invention.

The branch pipe 31 has an in-line heater 33 for controlling temperature of the first low surface tension solution in the treating tank 1 to be in a temperature range between the boiling point of deionized water and the boiling point of the first low surface tension solution. The in-line heater 33 heats the first low surface tension solution flowing through the branch pipe 31 to a range of 115-200° C., for example. The first low surface tension solution even at 115° C. can evaporate deionized water. It is preferred to heat the first low surface tension solution to a range of 130-200° C. In this case, deionized water can be evaporated more effectively. In this embodiment, the in-line heater 33 heats the first low surface tension solution flowing through the branch pipe 31 to a range of 150-200° C. In this case, deionized water can be evaporated still more effectively.

The inner tank 3 has a temperature detector 36 (e.g. temperature detecting sensor) mounted inside for detecting temperature of the first low surface tension solution. The temperature detected of the first low surface tension solution in the inner tank 3 is outputted to a controller 47. Based on the detected temperature, the controller 47 controls the heating temperature of the in-line heater 33 to maintain the temperature of the first low surface tension solution in the inner tank 3 in the range of 150-200° C.

The above arrangement may be modified to omit the temperature detector 36 from the inner tank 3, and use an in-line heater having a temperature control function as in-line heater 33. Then, the first low surface tension solution may be supplied in the range of 150-200° C. and in a sufficient quantity to replace the deionized water in the inner tank 3.

The above in-line heater 33 corresponds to the temperature control device in this invention. The deionized water corresponds to the first treating liquid in this invention. The first low surface tension solution corresponds to the second treating liquid in this invention. The second low surface tension solution corresponds to the third treating liquid in this invention.

The inner tank 3 has a discharge opening 41 formed in the bottom thereof, to which one end of a drain pipe 43 is connected. The other end of the drain pipe 43 is connected to a waste liquid disposal unit not shown. The drain pipe 43 has a flow control valve 45 for adjusting a flow rate therethrough.

The controller 47 performs an overall control of the apparatus including the vertical movement of the holding arm 7 and operations of the in-line heater 33 and control valves 21, 29, 37, 38 and 45. The controller 47 has a memory storing a recipe specifying procedures, a microprocessor and a counter/timer.

The above controller 47 corresponds to the control device in this invention.

Next, operation of the apparatus having the above construction will be described. Assume that the wafers W as held by the holding arm 7 have been moved to the treating position inside the inner tank 1. The holding arm 7 is omitted from FIG. 2 referred to hereinafter.

Treating operation in Embodiment 1 will be described with reference to FIG. 2. FIGS. 2A-2D are schematic views showing an example of treatment in Embodiment 1. In Embodiment 1, for example, treatment is carried out while producing the above-noted chemical solution of HF as treating solution, and thereafter the wafers W are cleaned with the other liquid and solutions and are then pulled up.

Specifically, the controller 47 operates the control valves 21 and 29 to supply the chemical solution at a predetermined flow rate (FIG. 2A). This state is maintained for a predetermined time to carry out chemical treatment of the wafers W.

Next, the controller 47 closes the control valve 29 to stop the supply of the chemical solution, while keeping the control valve 21 open to continue supplying the deionized water. As a result, cleaning treatment only with the deionized water is performed (FIG. 2B).

At this time, the controller 47 may open the control valve 45 of the drain pipe 43 connected to the discharge opening 41 in the bottom of the inner tank 3. Thus, the deionized water may be supplied into the inner tank 3 after discharging at once or while discharging the chemical solution from the inner tank 3.

After a predetermined time of cleaning treatment with the deionized water, the controller 47 closes the control valve 21 to stop the supply of deionized water, and opens the control valve 37 to supply Fluorinert (registered trademark of Sumitomo 3M Ltd.) heat transfer liquid, which is the first low surface tension solution, at a predetermined flow rate from the first solution source 34 to the treating tank 1. At this time, the in-line heater 33 heats the first low surface tension solution to the range of 150-200° C. This state is maintained for a predetermined time to replace the deionized water stored in the inner tank 3 with the first low surface tension solution in the range of 150-200° C. (FIG. 2C). After the replacement with the first low surface tension solution is completed, this state is maintained for a predetermined time. As noted hereinbefore, the controller 47 performs heating control of the in-line heater 33 based on the temperature of the first low surface tension solution detected by the temperature detector 36.

As shown in FIG. 2C, the wafers W are immersed for a predetermined time in the hot (130-200° C.) first low surface tension solution filling the treating tank 1. The deionized water remaining on the surfaces of wafers W is evaporated by the thermal energy of the hot first low surface tension solution. Its bubbles ascend to the surface of the first low surface tension solution in the treating tank 1, and leave the treating tank 1 in the form of vapor. Even part of the deionized water having entered and remaining in minutia of the patterns on the surfaces of wafers W is evaporated by the thermal energy of the hot first low surface tension solution. Again, its bubbles ascend to the surface of the first low surface tension solution in the treating tank 1, and leave the treating tank 1 in the form of vapor.

The vapor coming out of the treating tank 1 is exhausted by an exhaust mechanism 39 disposed above the treating tank 1.

A completion time for the replacement with the first low surface tension solution is determined by the controller 47, for example, from the capacity of the inner tank 3 which is known, and the flow rate of the first low surface tension solution supplied.

After the replacement with the first low surface tension solution, the controller 47 causes the hydrofluoroether (HFE) to be supplied as the second low surface tension solution at a predetermined flow rate. This is continued for a predetermined time to replace the first low surface tension solution stored in the inner tank 3 with the second low surface tension solution (FIG. 2D). When the replacement of the chemical solution with the second low surface tension solution is completed, the controller 47 pulls up the wafers W from the inner tank 3 to be unloaded from the apparatus (FIG. 2D).

At this time, the controller 47 may open the control valve 45 of the drain pipe 43 connected to the discharge opening 41 in the bottom of the inner tank 3. Thus, the second low surface tension solution may be supplied into the inner tank 3 after discharging at once or while discharging the first low surface tension solution from the inner tank 3.

A completion time for the replacement with the second low surface tension solution is determined by the controller 47, for example, from the capacity of the inner tank 3 which is known, and the flow rate of the second low surface tension solution supplied.

According to Embodiment 1, as described above, the controller 47 controls the control valve 37 to replace the deionized water stored in the treating tank 1 with the first low surface tension solution, and controls the in-line heater 33 to maintain the first low surface tension solution in the treating tank 1 in the temperature range above the boiling point of deionized water and below the boiling point of the first low surface tension solution. Therefore, the wafers W treated with the deionized water in the treating tank 1 are immersed in the first low surface tension solution controlled to a temperature higher than the boiling point of deionized water. The deionized water remaining on the surfaces of wafers W (including the deionized water having entered and remaining in minutia of the patterns on the surfaces of wafers W) is evaporated by the thermal energy of the hot first low surface tension solution. Its bubbles ascend to the surface of the first low surface tension solution in the treating tank 1, and leave the treating tank 1 in the form of vapor. Thus, the deionized water having entered and remaining in minutia of the patterns on the surfaces of wafers W can be completely replaced with the first low surface tension solution. The wafers W taken out of the treating tank 1 do not pass through the interface of deionized water having high surface tension, but pass only through an interface IF of the second low surface tension solution of lower surface tension than deionized water (see FIG. 2D). Only the low surface tension acts on the surfaces of wafers W when passing through the interface IF of the second low surface tension solution, thereby preventing collapse of the patterns formed on the wafers W. Only the first low surface tension solution with the low surface tension remains on the surfaces of wafers W pulled up. The surfaces of wafers W are subjected to the low surface tension when drying the first low surface tension solution, which prevents collapse of the patterns formed on the wafers W.

The first low surface tension solution stored in the treating tank 1 is replaced with the second low surface tension solution of lower surface tension than deionized water and lower boiling point than the first low surface tension solution, and then the wafers W are pulled up and dried. This requires a shorter drying time than where the wafers W are pulled up out of the first low surface tension solution. That is, the second low surface tension solution allows the wafers W to dry more quickly than the first low surface tension solution because of the lower boiling point.

The boiling point of deionized water is 100° C., and the first low surface tension solution is a fluoric inactive liquid having low surface tension and a sufficiently higher boiling point than deionized water. Thus, the first low surface tension solution can assure a good distillation selection ratio with deionized water to evaporate deionized water effectively.

Since both the first low surface tension solution and second low surface tension solution are fluoric inactive liquids, the first low surface tension solution is easily replaceable with the second low surface tension solution. Thus, the replacement with the second low surface tension solution can be carried out in a reduced time to shorten the drying time.

Embodiment 2

Next, Embodiment 2 of this invention will be described with reference to FIGS. 3 and 4.

Figure 3:
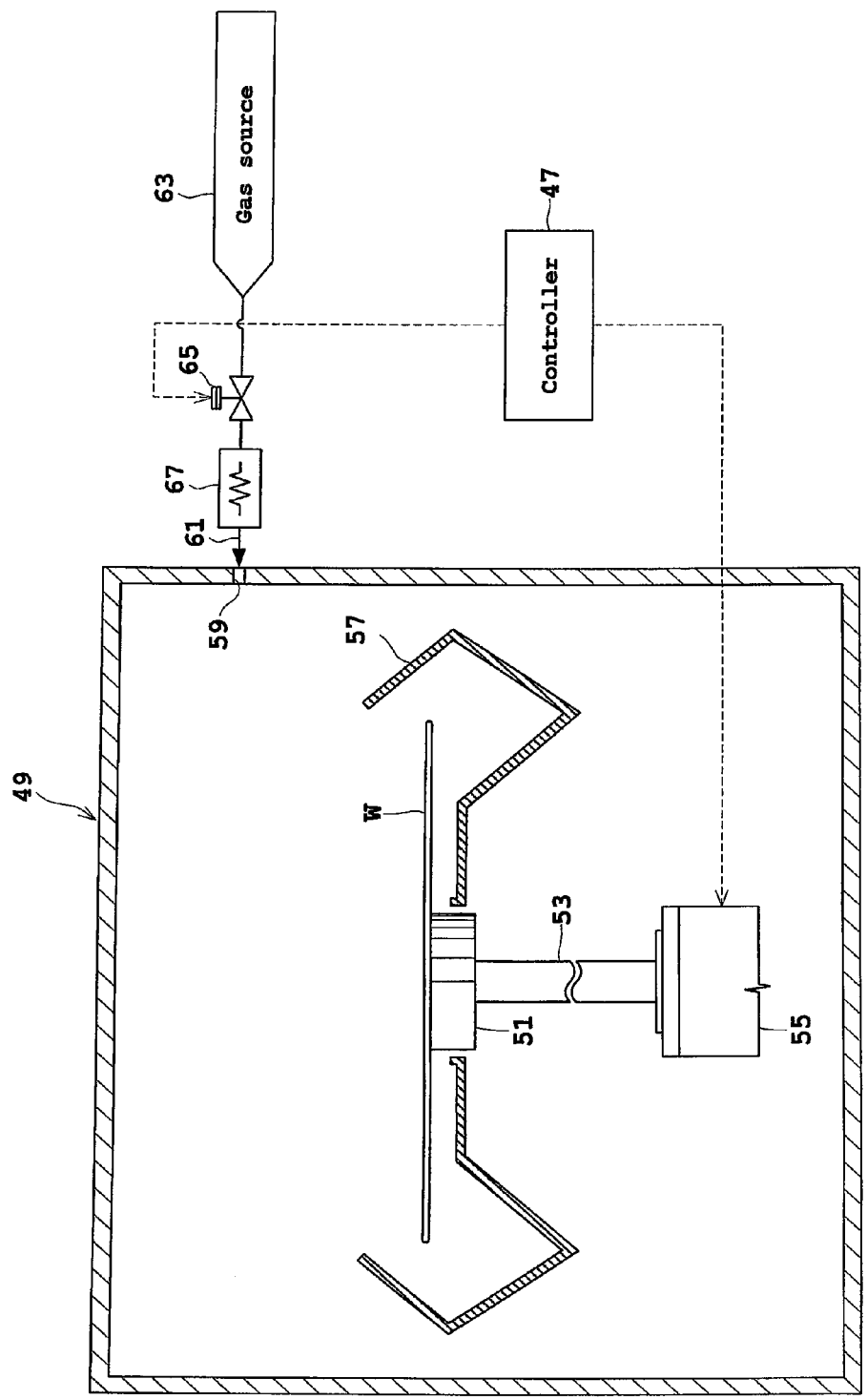
FIG. 3 is a schematic view of a drying apparatus which is a substrate treating apparatus in Embodiment 2.
Figure 4:
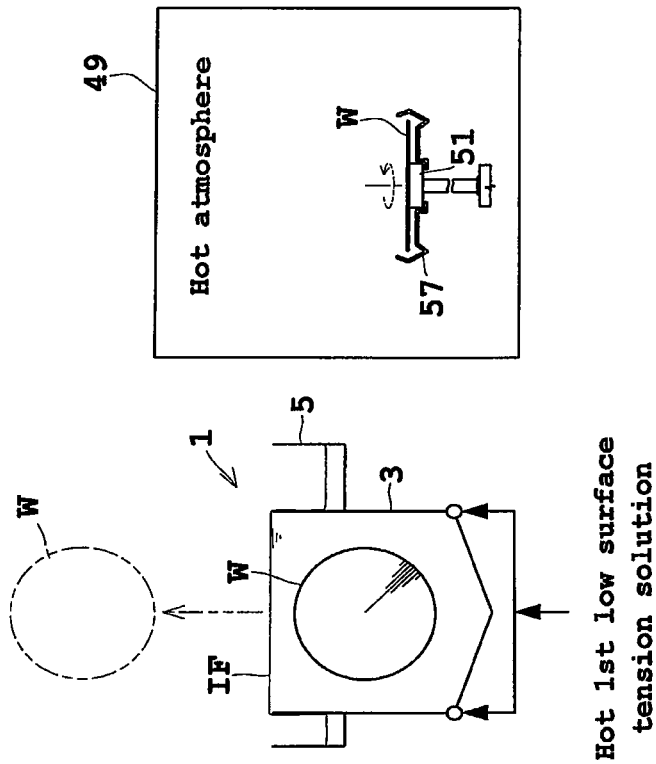
FIGS. 4A-4D are schematic views showing an example of treatment in Embodiment 2.

FIG. 3 is a schematic view of a drying apparatus which is a substrate treating apparatus in Embodiment 2. FIGS. 4A-4D are schematic views showing an example of treatment in Embodiment 2. Like reference numerals are used to identify like parts which are the same as in Embodiment 1 and will not particularly be described.

In Embodiment 1 described above, as shown in FIG. 2, the single treating tank 1 is used for the chemical treatment, deionized water cleaning treatment, replacement with the first low surface tension solution, replacement with the second low surface tension solution, and pull-up and drying treatment. Embodiment 2 is different from Embodiment 1 in that, as shown in FIG. 4, the replacement with the second low surface tension solution is now abolished and, in place of the pull-up and drying, a construction is employed for carrying out spin-drying (heater plus spin-drying) in a hot atmosphere.

After wafers W are immersed in the hot first low surface tension solution as in Embodiment 1 (FIG. 4C), each wafer W is transported by a substrate transport mechanism, not shown, into a drying chamber (FIG. 4D). Each wafer W is dried in this drying chamber.

The drying chamber has a thermal drying function to dry in a hot atmosphere the wafers W treated with the first low surface tension solution, and an air drying function to dry the wafers W through contact with air.

Specifically, as shown in FIG. 3, a drying chamber 49 is a drying chamber of what is called the single-substrate type for treating one wafer W at a time. The drying chamber 49 includes a chuck 51 (holding mechanism) for supporting a wafer W in horizontal posture, a rotary shaft 53 connected to the lower end of the chuck 51, a motor 55 (actuator) for rotating the rotary shaft 53, and a scatter preventive cup 57 surrounding the chuck 51. The scatter preventive cup 57 collects the first low surface tension solution scattering from the wafer W, and is vertically movable relative to the chuck 51.

The drying chamber 49 has an inlet port 59 formed in a predetermined position thereof to which one end of a gas feed pipe 61 is connected. The other end of the gas feed pipe 61 is connected to a gas source 63. The gas feed pipe 61 has a control valve 65 and an in-line heater 67 arranged in order from upstream to downstream thereon.

After the treatment with the first low surface tension solution maintained in the temperature range noted in Embodiment 1, the controller 47 controls the drying chamber 49 to dry each wafer W in the hot atmosphere, and spins the chuck 51 to dry the wafer W through contact with air.

Specifically, as shown in FIGS. 3 and 4D, the controller 47 opens the control valve 65 to supply a gas (e.g. nitrogen gas) from the gas source 63, and heat the gas with the in-line heater 67. The nitrogen gas is supplied at a predetermined temperature into the drying chamber 49. When the drying chamber 49 is filled with a hot atmosphere, the wafer W is spun by the chuck 51 to dry and remove the first low surface tension solution remaining on the surface of wafer W.

According to Embodiment 2, as described above, the drying chamber 49 is provided for drying in a hot atmosphere each wafer W treated with the first low surface tension solution, and spin-drying the wafer W. After the treatment with the first low surface tension solution, the controller 47 controls the drying chamber 49 to dry each wafer W in the hot atmosphere and by spinning the wafer W. The deionized water having entered and remaining in minutia of the patterns on the surfaces of wafers W is evaporated and removed through the treatment with the first low surface tension solution. The first low surface tension solution having low surface tension and remaining on the surface of each W can be dried effectively by spinning the wafer W in the hot atmosphere, thereby preventing collapse of the pattern formed on the wafer W.

The wafers W taken out of the treating tank 1 do not pass through the interface of deionized water having high surface tension, but pass only through an interface IF of the first low surface tension solution having a lower surface tension than deionized water (see FIG. 4C). Only the lower surface tension acts on the surfaces of wafers W when passing through the interface IF of the first low surface tension solution, thereby preventing collapse of the patterns formed on the wafers W.

Embodiment 3

Next, Embodiment 3 of this invention will be described with reference to FIGS. 5 and 6.

Figure 5:
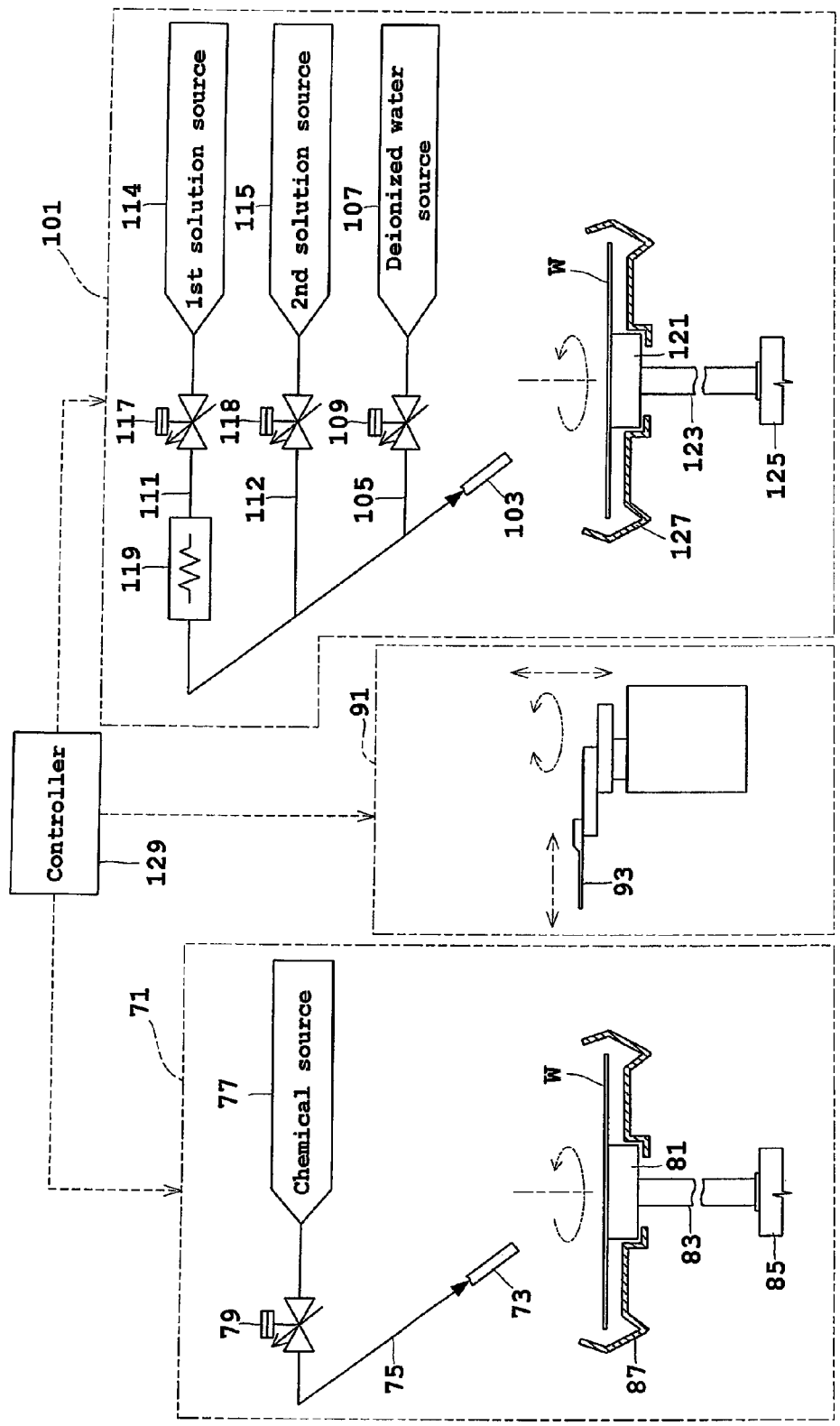
FIG. 5 is a schematic view of a substrate treating apparatus in Embodiment 3.

FIG. 5 is a schematic view of a substrate treating apparatus in Embodiment 3. FIGS. 6A-6E are schematic views showing an example of treatment in Embodiment 3. Like reference numerals are used to identify like parts which are the same as in Embodiment 1 and will not particularly be described.

Embodiment 1 described hereinbefore, as shown in FIG. 2, provides a batch type construction where the single treating tank 1 is used for the chemical treatment, deionized water cleaning treatment, replacement with the first low surface tension solution, replacement with the second low surface tension solution, and pull-up and drying treatment. Embodiment 3 is different from Embodiment 1 in that, as shown in FIGS. 5 and 6, a single-substrate type construction is employed for carrying out chemical treatment, deionized water cleaning treatment, replacement with the first low surface tension solution, replacement with the second low surface tension solution, and drying treatment.

As shown in FIG. 5, the apparatus in Embodiment 3 includes a chemical treating chamber 71, a cleaning chamber 101 separate from the chemical treating chamber 71, and a transport mechanism 91 for transporting wafers W having undergone chemical treatment in the chemical treating chamber 71 to the cleaning chamber 101.

As shown in FIG. 5, the chemical treating chamber 71 is a treating chamber of what is called the single-substrate type for treating one wafer W at a time. Specifically, the chemical treating chamber 71 includes a nozzle 73, a pipe 75 having one end thereof connected to the nozzle 73, a chemical source 77 connected to the other end of the pipe 75, and a control valve 79 mounted in an intermediate position on the pipe 75.

The chemical treating chamber 71 further includes a chuck (holding mechanism) 81 for supporting a wafer W in horizontal posture, a rotary shaft 83 connected to the lower end of the chuck 81, a motor 85 (actuator) for rotating the rotary shaft 83, and a scatter preventive cup 87 surrounding the chuck 81. The scatter preventive cup 87 collects the first low surface tension solution scattering from the wafer W, and is vertically movable relative to the chuck 81.

The transport mechanism 91 has an arm 93. The arm 93 is driven, with the scatter preventive cup 87 of the chemical treating chamber 71 lowered (i.e. in a retracted state), to receive the wafer W from the chuck 81 as placed on the arm 93. Then, the arm 93 is swung in a horizontal plane toward the cleaning chamber 101 and, with a scatter preventive cup 127 of the cleaning chamber 101 lowered (i.e. in a retracted state), places the wafer W on a chuck 121.

As shown in FIG. 5, the cleaning chamber 101 is a cleaning chamber of what is called the single-substrate type for treating one wafer W at a time. Specifically, the cleaning chamber 101 includes a nozzle 103, a pipe 105 having one end thereof connected to the nozzle 103, a deionized water source 107 connected to the other end of the pipe 105, and a control valve 109 mounted in an intermediate position on the pipe 105. The pipe 105 has one end of each of branch pipes 111 and 112 connected thereto. A first solution source 114 is connected to the other end of the branch pipe 111. A second solution source 115 is connected to the other end of the branch pipe 112. The branch pipes 111 and 112 have control valves 117 and 118 mounted thereon for controlling flow rates therethrough, respectively.

The cleaning chamber 101 has the chuck (holding mechanism) 121 for supporting the wafer W in horizontal posture, a rotary shaft 123 connected to the lower end of the chuck 121, a motor (actuator) 125 for rotating the rotary shaft 123, and the scatter preventive cup 127 surrounding the chuck 121. The scatter preventive cup 127 collects deionized water, a first low surface tension solution and a second low surface tension solution scattering from the wafer W. The scatter preventive cup 127 is vertically movable relative to the chuck 121.

The branch pipe 111 has an in-line heater 119 for controlling temperature of the first low surface tension solution supplied to the wafer W to be in a temperature range between the boiling point of deionized water and the boiling point of the first low surface tension solution. The in-line heater 119 has a temperature control function for providing a temperature range of 115-200° C. based on a temperature command from a controller 129 to be described hereinafter. The in-line heater 33 heats the first low surface tension solution flowing through the branch pipe 111 to the range of 115-200° C., for example. The first low surface tension solution even at 115° C. can evaporate deionized water. It is preferred to heat the first low surface tension solution to a range of 130-200° C. In this case, deionized water can be evaporated more effectively. In this embodiment, the in-line heater 119 heats the first low surface tension solution flowing through the branch pipe 111 to be in a range of 150-200° C. In this case, deionized water can be evaporated still more effectively.

The first low surface tension solution and second low surface tension solution are the same as in Embodiment 1, and will not particularly be described here.

The controller 129 performs an overall control of the apparatus including the chemical treating chamber 71, transport mechanism 91 and cleaning chamber 101. The controller 129 has a memory storing a recipe specifying procedures, a microprocessor and a counter/timer. Specifically, the controller 129 controls the spin of the chuck 81, vertical movement of the scatter preventive cup 87 and the control valve 79 in the chemical treating chamber 71, the arm 93 of the transport mechanism 91, the spin of the chuck 121, vertical movement of the scatter preventive cup 127, the control valves 109, 117 and 118 and in-line heater 119 in the cleaning chamber 101.

The above chuck 121 corresponds to the spin holding mechanism in this invention. The cleaning chamber 101 corresponds to the treating unit in this invention. The nozzle 103, pipe 105 and control valve 109 correspond to the first treating solution supply device in this invention. The nozzle 103, branch pipe 111 and control valve 117 correspond to the second treating solution supply device in this invention. The nozzle 103, branch pipe 112 and control valve 118 correspond to the third treating solution supply device in this invention. The in-line heater 119 corresponds to the temperature control device in this invention. The controller 129 corresponds to the control device in this invention.

Next, operation of the apparatus in Embodiment 3 will be described. Assume that a wafer W is held and spun by the chuck 81.

Treating operation in Embodiment 3 will be described with reference to FIG. 6. In Embodiment 3, for example, HF treatment is carried out in the chemical treating chamber 71 while producing the above-noted chemical solution of HF as treating solution, and thereafter the wafer W is cleaned with the other liquid and solutions and is then spin-dried in the cleaning chamber 101.

Specifically, the controller 129 operates the control valve 79 to supply the chemical solution at a predetermined flow rate to the wafer W turning at low speed (FIG. 6A). This state is maintained for a predetermined time to carry out chemical treatment of the wafer W turning at low speed.

Next, the controller 129 closes the control valve 79 of the chemical treating chamber 71 to stop the supply of the chemical solution, and stops turning of the wafer W. With the scatter preventive cup 87 of the chemical treating chamber 71 lowered (i.e. in the retracted state), the controller 129 causes the transport mechanism 91 to transfer the wafer W from chuck 81 onto the arm 93, and to swing the arm 93 in the horizontal plane toward the cleaning chamber 101. With the scatter preventive cup 127 of the cleaning chamber 101 lowered (i.e. in the retracted state), the arm 93 is driven to place the wafer W on the chuck 121.

When the wafer W is spinnably held by the chuck 121 in the cleaning chamber 101, the controller 129 turns the wafer W at low speed, and opens the control valve 109 to supply deionized water from the nozzle 103 to the surface of wafer W. As a result, cleaning treatment only with the deionized water is performed (FIG. 6B).

After a predetermined time of cleaning treatment with the deionized water, the controller 129 closes the control valve 109 to stop the supply of deionized water, and opens the control valve 117 to supply Fluorinert (registered trademark of Sumitomo 3M Ltd.) heat transfer liquid, which is the first low surface tension solution, at a predetermined flow rate from the first solution source 114 to the wafer W turning at low speed. At this time, the in-line heater 119 heats the first low surface tension solution to the range of 150-200° C. This state is maintained for a predetermined time to replace the deionized water on the wafer W with the first low surface tension solution in the range of 150-200° C. (FIG. 6C). After the replacement with the first low surface tension solution is completed, this state is maintained for a predetermined time.

As shown in FIG. 6C, the wafer W has its surface covered by the hot (150-200° C.) first low surface tension solution. The deionized water remaining on the surface of wafer W is evaporated by the thermal energy of the hot first low surface tension solution, and leaves the wafer W in the form of vapor. Even part of the deionized water having entered and remaining in minutia of the pattern on the surface of wafer W is evaporated by the thermal energy of the hot first low surface tension solution, and leaves the wafer W in the form of vapor.

The vapor departing from the wafer W is exhausted by an exhaust mechanism, not shown, disposed above the cleaning chamber 101.

A completion time for the replacement with the first low surface tension solution is determined by the controller 129, for example, from the quantity of a puddle formed on and the quantity scattering from the wafer W which are known, and the flow rate of the first low surface tension solution supplied.

After the replacement with the first low surface tension solution, the controller 129 causes the hydrofluoroether (HFE) to be supplied as the second low surface tension solution at a predetermined flow rate to the wafer W turning at low speed. This is continued for a predetermined time to replace the first low surface tension solution on the wafer W with the second low surface tension solution (FIG. 6D). When the replacement of the chemical solution with the second low surface tension solution is completed, the controller 129 stops the supply of the second low surface tension solution from the nozzle 103, and turns the wafer W at low speed to dry (FIG. 6E).

A completion time for the replacement with the second low surface tension solution is determined by the controller 129, for example, from the quantity of a puddle formed on and the quantity scattering from the wafer W which are known, and the flow rate of the second low surface tension solution supplied.

According to Embodiment 3, as described above, the apparatus includes the cleaning chamber 101 having the chuck 121 disposed therein for holding a wafer W to be rotatable in horizontal posture, and treating the wafer W held by the chuck 121 with the treating liquid and solutions, the first treating solution supply device (i.e. the nozzle 103, pipe 105 and control valve 109) for supplying deionized water to the wafer W turned at low speed by the chuck 121 in the cleaning chamber 101, the second treating solution supply device (i.e. the nozzle 103, branch pipe 111 and control valve 117) for supplying the first low surface tension solution of lower surface tension than deionized water and higher boiling point than deionized water to the wafer W turned at low speed by the chuck 121 in the cleaning chamber 101, the in-line heater 119 for controlling the temperature of the second low surface tension solution supplied to the wafer W turned at low speed by the chuck 121 in the cleaning chamber 101 to the temperature range above the boiling point of deionized water and below the boiling point of the first low surface tension solution, and the controller 129 for controlling the in-line heater 119 and second treating solution supply device (i.e. the nozzle 103, branch pipe 111 and control valve 117) to supply the first low surface tension solution in the above temperature range to the wafer W turned at low speed by the chuck 121 in the cleaning chamber 101 after the treatment of the wafer W with deionized water. Thus, the first low surface tension solution controlled to a temperature higher than the boiling point of deionized water is supplied to the wafer W treated with deionized water in the cleaning chamber 101. The deionized water remaining on the surface of wafer W (including the deionized water having entered and remaining in minutia of the pattern on the surface of wafer W) is evaporated by the thermal energy of the hot first low surface tension solution, leaves the surface of wafer W, and exits the cleaning chamber 101 in the form of vapor. Thus, the deionized water having entered and remaining in minutia of the pattern on the surface of wafer W can be completely replaced with the first low surface tension solution. Only the first low surface tension solution having low surface tension remains on the surface of wafer W. The surface of wafer W is subjected to the low surface tension when drying the first low surface tension solution, which prevents collapse of the pattern formed on the wafer W.

The first low surface tension solution on the surface of wafer W is replaced with the second low surface tension solution of lower surface tension than deionized water and lower boiling point than the first low surface tension solution, and then the wafer W is spin-dried. This requires a shorter drying time than where the wafer W is dried by being turned at low speed with the first low surface tension solution remaining thereon. That is, the second low surface tension solution allows the wafer W to dry more quickly than the first low surface tension solution because of the lower boiling temperature.

The boiling point of deionized water is 100° C., and the first low surface tension solution is a fluoric inactive liquid having low surface tension and a sufficiently higher boiling point than deionized water. Thus, the first low surface tension solution can assure a good distillation selection ratio with deionized water to evaporate deionized water effectively.

Since both the first low surface tension solution and second low surface tension solution are fluoric inactive liquids, the first low surface tension solution is easily replaceable with the second low surface tension solution. Thus, the replacement with the second low surface tension solution can be carried out in a reduced time to shorten the drying time.

This invention is not limited to the foregoing embodiments, but may be modified as follows:

(1) In Embodiment 1 described hereinbefore, the treating tank 1 is open. Instead, the treating tank 1 may be enclosed in a chamber, with an openable cover disposed on an upper part of the inner tank 3. Further, a nozzle may be disposed in an upper space of the chamber for supplying a solvent gas. When pulling up the wafers W, the upper space is filled with a solvent atmosphere, the cover is opened, and the holding arm 7 is raised, thereby replacement with the solvent is effected when the wafers W are pulled up.

(2) In Embodiment 1 described hereinbefore, as shown in FIGS. 2A-2D, the single treating tank 1 is used for the chemical treatment, deionized water cleaning treatment, replacement with the first low surface tension solution, replacement with the second low surface tension solution, and pull-up and drying treatment. A separate treating tank or treating chamber may be provided for the chemical treatment, and the treating tank 1 used for the deionized water cleaning treatment, replacement with the first low surface tension solution, replacement with the second low surface tension solution, and pull-up and drying treatment.

(3) In Embodiment 2 described hereinbefore, the drying chamber 49 spins the wafer W in a hot atmosphere. The wafer W may be dried by exposure to the hot atmosphere without the spinning, or may be dried without using the hot atmosphere, and only by spinning the wafer W.

(4) In Embodiments 1 and 2 described hereinbefore, two or more treating solutions are used. It is therefore desirable to provide a plurality of branch pipes and switch valves branched from the drain port 15 and discharge opening 41. The pipes may be switched according to the treating solutions discharged, to change collecting locations for the different treating solutions. As a result, each treating solution can be collected separately to facilitate waste disposal.

(5) In Embodiment 3 described hereinbefore, as shown in FIGS. 6A-6E, spin-drying treatment is carried out after the replacement with the second low surface tension solution in the cleaning chamber 101. Instead, as shown in FIG. 7E, the wafer W may be dried in a hot atmosphere such as of nitrogen gas after the replacement with the second low surface tension solution.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating method for treating substrates with treating liquids, comprising the steps of:

holding a substrate in a spin holding mechanism in a treating unit and spinning the substrate in a horizontal posture;

supplying a first treating liquid to the substrate spun by said spin holding mechanism to treat the substrate with the first treating liquid covering entire surfaces of the substrate;

supplying a second treating liquid to the substrate spun by said spin holding mechanism to treat the substrate with the second treating liquid covering the entire surfaces of the substrate, the second treating liquid having lower surface tension than the first treating liquid, and higher boiling point than the first treating liquid, while controlling the second treating liquid to be in a temperature range above the boiling point of the first treating liquid and below the boiling point of the second treating liquid;

supplying, after substrate treatment with the second treating liquid, a third treating liquid of lower surface tension than the first treating liquid, and lower boiling point than the second treating liquid, to the substrate spun by said spin holding mechanism, to treat the substrate with the third treating liquid covering the entire surfaces of the substrate; and after treating the substrate with the third treating liquid, controlling said spin holding mechanism to spin-dry the substrate.

2. The method as defined in claim 1, wherein the first treating liquid is deionized water, and the second treating liquid has surface tension equal to or less than 0.02 [N/m].

3. The method as defined in claim 1, wherein the first treating liquid is deionized water, and the second treating liquid is a liquid containing fluorine.

4. The method as defined in claim 1, wherein the first treating liquid is deionized water, and the second treating liquid and the third treating liquids are a liquid containing fluorine having surface tension equal to or less than 0.02 [N/m].

5. The method as defined in claim 1, wherein the first treating liquid is deionized water, and the second treating liquid has surface tension equal to or less than 0.02 [N/m].

* * * * *